(12) United States Patent
Wente

(10) Patent No.: US 6,438,721 B1
(45) Date of Patent: Aug. 20, 2002

(54) METHOD FOR TESTING A CURRENT MODE INTERPOLATOR

(75) Inventor: Douglas Wente, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/362,543

(22) Filed: Jul. 28, 1999

Related U.S. Application Data

(60) Provisional application No. 60/094,404, filed on Jul. 28, 1998.

(51) Int. Cl.[7] .......................... G01R 31/28; H03M 1/10
(52) U.S. Cl. ....................... 714/731; 714/733; 341/120
(58) Field of Search ................................ 714/731, 733, 714/745; 341/120, 144, 136, 61; 327/156, 159; 708/313; 331/17, 25

(56) References Cited

U.S. PATENT DOCUMENTS

| | | | |
|---|---|---|---|
| 5,748,125 A | * | 5/1998 | Goderbaum et al. ........ 341/136 |
| 5,786,778 A | | 7/1998 | Adams et al. ................. 341/61 |
| 5,955,980 A | * | 9/1999 | Hanna ......................... 341/120 |
| 6,005,425 A | * | 12/1999 | Cho ............................. 327/156 |

* cited by examiner

*Primary Examiner*—Emmanuel L. Moise
(74) *Attorney, Agent, or Firm*—Pedro P. Hernandez; W. James Brady, III; Frederick J. Telecky, Jr.

(57) ABSTRACT

In systems requiring the alignment of two clock signals or the alignment of a clock signal to a serial data stream, a current mode interpolator is often used to position the output clock signal. Traditional scan tests using external pins of the device are inappropriate because of their timing penalty and other built in self tests are inappropriate because of a large area or circuit complexity penalty. Therefore, a built in self test has been developed that does not impact the normal performance of the device and requires minimal additional circuitry. In this method, a small digital state machine is utilized to force the digital control logic for the current mode interpolator such that a single bit current comparator is sufficient to detect defects in the digital control logic and the current mode interpolator.

8 Claims, 3 Drawing Sheets

METHOD FOR TESTING A CURRENT MODE INTERPOLATOR

This application claims priority under 35 USC §199(e)(1) of provisional application number 60/094,404 filed Jul. 28, 1998.

FIELD OF INVENTION

The invention relates generally to the field of electronic circuits and more particularly to the testing of clock positioning circuits.

BACKGROUND OF INVENTION

FIG. 1 is a prior art block drawing illustrating a general system 10 designed to align two clock signals. Such a system may be used, for example in memory subsystems for PCs and other computer based systems. [As will be explained below, the particularly relevant blocks to the invention, namely the phase select logic 20 (digital in nature) and the interpolator 16 (analog in nature), can also be used in systems that need to align a clock to a serial data stream. Such systems have usefulness in many types applications, such as gigabit ethernet, computer backplanes, and telecommunications systems.]

In FIG. 1, a phase locked loop 14 generates eight free running clock signals evenly spaced in phase. From these eight phase signals, a clock signal is generated that when divided down becomes the PCLK input of a phase detector 12 and is phase aligned to the SYNCLK input. In the example system 10, the output of an interpolator block 16b has a frequency of 400 MHz, which is divided down to 25 MHz at the input of the phase detector 12. (Interpolator 16 is illustrated as 2 blocks in FIG. 1: a current switch array 16a and interpolator 16b). Two multiplexors 18a and 18b each take four of the clock signals generated by the phase lock loop 14 and pass one of them to interpolator 16b based on a selection signal from the sector register in the phase select logic 20. A current switch array 16a also receives a sixteen-bit control word from phase select logic 20. The interpolator 16 generates a clock signal somewhere in between the two clock phases it receives from multiplexors 18a and 18b. When all sixteen bits of a control word are logic 0, the output of the interpolator will be in phase with the clock phase from multiplexor 18a. When all sixteen bits of a control word are logic 1, the output of the interpolator will be in phase with the clock signal from multiplexor 18b. All other control words result in a clock that is positioned somewhere between these two extremes. The output of the interpolator is divided down by divider 22 to generate the PCLK input to phase detector 12. The phase detector 12 analyzes the phase difference between the SYNCLK and PCLK inputs and decides whether the phase of PCLK should be advanced or retarded. This decision is sent to the phase select logic 20 via the DIR signal. The interpolator 16 is physically located in an analog circuitry portion of system 10.

FIG. 2 is prior art drawing illustrating the interpolator 16 in further detail. The current switch array 16a consists of sixteen current source transistors T1–T16 connected to sixteen differential transistor pairs D1–D16. The sixteen current source transistors all have the same channel width and thus are the same size to output identical units of current Iu. The differential pair outputs are connected to node SRCO and node SRCE of an interpolator block 16b. The sixteen differential transistor pairs are controlled by sixteen D flip-flops FF1–FF16 that form a thermometer code register 20a. The thermometer code register 20a is referred to as such because the bits B0–B16 are always a sequence of logic 0's followed by a sequence of logic 1's during normal operation. The flip flops and the differential pairs determine whether the currents from the current source transistors go through node SRCE or node SRCO. When the output of a flip flop is logic 1, that unit current is steered through SRCO and when the output is logic 0, the current is steered through node SRCE. Thus if n of the bits are logic 1, current IO will be n Iu and current IE will be (16−n)Iu.

The interpolator block 16b receives the two clock phases from multiplexors 18a and 18b. A first differential transistor pair P1 receives the clock phase from multiplexor 18a on transistors IN1P and IN1N and a second differential transistor pair P2 receives the clock phase from multiplexor 18b on transistors IN2P and IN2N. Interpolator 16 is referred to as a current mode interpolator because the phase of the output clock is determined by the ratio of IO to the sum of IO and IE.

Recall that the application of the system of prior art FIG. 1 is to minimize the phase difference between the PCLK and SYNCLK inputs and ideally force this phase difference to zero. In the application wherein the system 10 is employed in a computer memory system operating at about 400 MHz, a single missing code in the current switch array 16a may result in an increase of the phase difference of only around 10 picoseconds; that is, the clock phase can be positioned to about 10 picosecond resolution. The missing code in the current switch array 16a could result from a variety of different sources, such as, for example, a stuck phase select code register bit from phase select block 20 of FIG. 1 or a bad differential pair D1–D16 within current switch array 16a. The 10 picosecond resolution is not a catastrophic failure and the device employing the system will pass typical external tests that are applied to the pins of the device (the system 10 is typically part of an integrated circuit having input/output package pins); however, the device is not optimal and the manufacturer probably would not want to ship it to a customer. The problem with the typical external tests is that the manufacturer cannot identify if an individual one of the current sources is bad from the pin boundary of the device. Thus, manufacturing defects of the clock positioning circuit are unable to be located by looking at the outputs of a tester.

Some prior art test techniques employ scan boundary methods to perform internal test. Such methods are unsuitable for the device of prior art FIGS. 1 and 2 as the clock positioning circuit is very timing sensitive. What is needed is a method to test for defects within the current switch array and phase select block without impacting the normal timing of the device.

It is accordingly an object of the invention herein to provide a method for testing a current mode interpolator.

Other objects and advantages of the invention herein will be apparent to those of ordinary skill in the art having the benefit of the description herein.

SUMMARY OF THE INVENTION

A built in self test method checks a current mode clock interpolator circuit by controlling the state of a thermometer code register and comparing the current from a current switch array to a reference current.

DETAILED DESCRIPTION OF THE DRAWINGS

DETAILED DESCRIPTION OF PREFERRED EMBODIMENT

Figure 1:
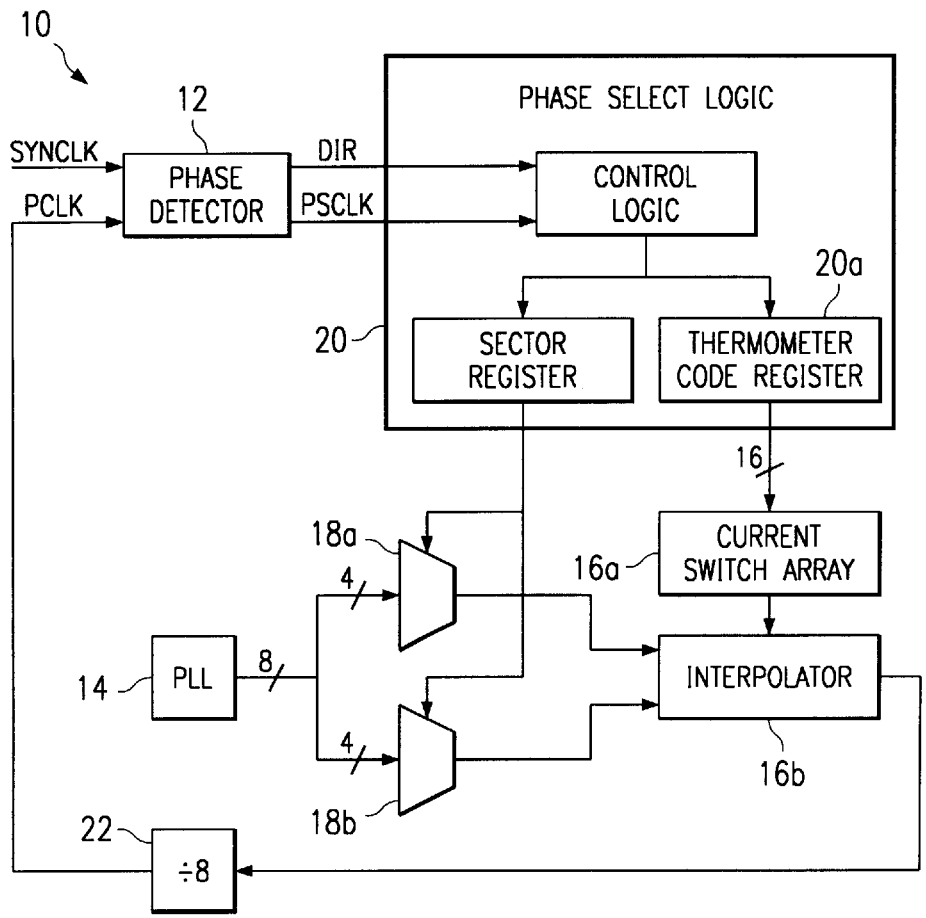
FIG. 1 is a prior art block drawing illustrating a system designed to minimize the phase difference between to input clocks.

As will be explained below, the method of the invention is a built in self test (BIST) that uses the current comparator circuitry 16d (illustrated in FIG. 3) to perform testing of the current switch array 16a. The method of the invention also uses a digital state machine that takes control of the phase-select logic 20 in performing the test. The method thus can detect any stuck at faults on the outputs of the thermometer code register 20a as well as detecting opens between the differential pairs D1–D16 of the current switch array 16a and either the current source transistors T1–T16 or the input devices of interpolator 16b (IN1P, IN1N, IN2P and IN2N). Other faults in the analog portion of the interpolator 16 are also detected. In addition, the method also will test every path through the phase select logic 20 (excepting the sector update logic portion).

Figure 2:
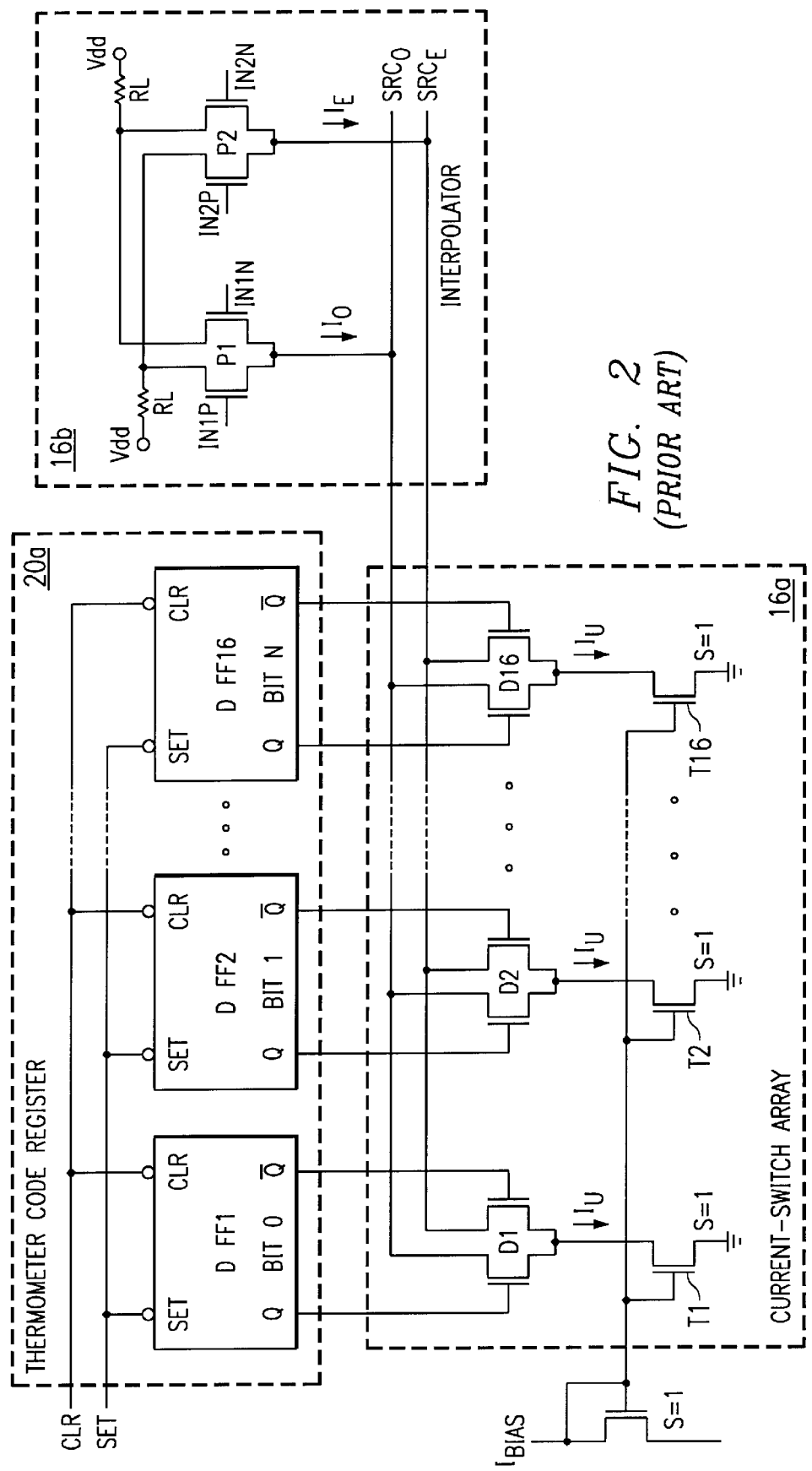
FIG. 2 is a prior art drawing illustrating a current mode interpolator within the system of FIG. 1.
Figure 3:
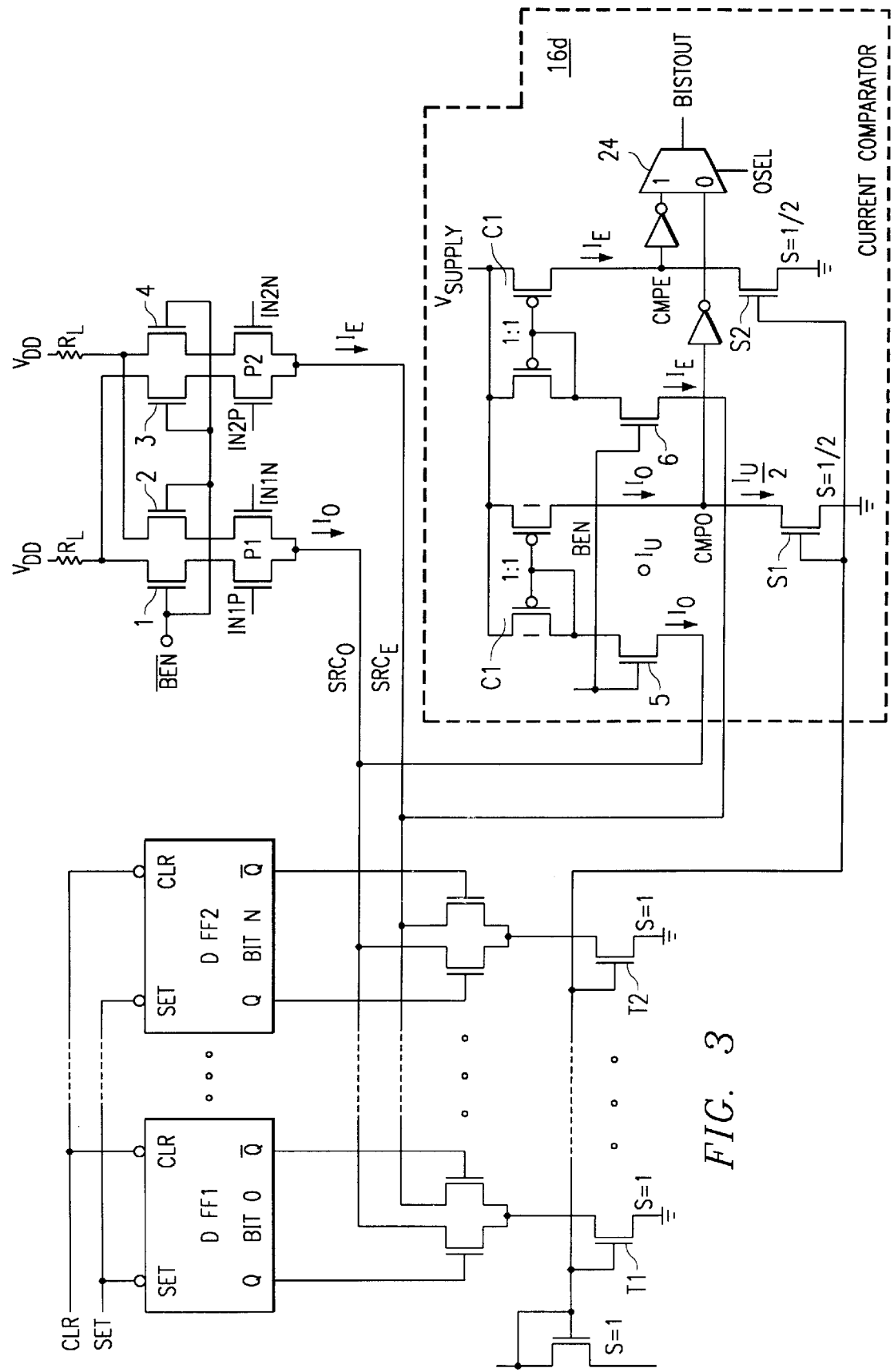
FIG. 3 is a drawing illustrating a preferred embodiment of a current comparator used by the method of the invention.

FIG. 3 is a drawing illustrating a preferred embodiment of a current comparator 16d added to the interpolator circuit of prior art FIG. 2. Current comparator 16d consists of two current mirrors C1 and C2 and two current sources S1 and S2. The n-channel transistors of current sources S1 and S2 are sized so that they are one half the size of transistors T1–T16 of the current switch array 16a. As such, current sources S1 and S2 provide about ½ unit of current as compared to the unit of current Iu of current switch array 16a. The current mirrors C1 and C2 generate a copy of the currents IO and IE into nodes CMPO and CMPE respectively. Current mirror C1 and current source S1 forms a current comparator which compares current IO with ½Iu and outputs a logic 1 when IO equals zero and a logic 0 when IO is greater than ½Iu. The same operation is performed by current mirror C2 and current source S2 for current IE. The multiplexor 24 selects one of the two comparator outputs as the final output of the BIST circuitry based on the state of the digital state machine which will described later. Thus, the analog circuitry utilized by the built in self test occupies very little area on the silicon die as few components are used.

In FIG. 3, four transistors 1–4 are added to the differential pairs P1 and P2 of interpolator 16b. These transistors 1–4 are on in the normal mode of operation and do not affect the circuit. Also transistors 5 and 6 in the current comparator 16d are turned off in normal operation so that current IO and IE flow through the differential pairs P1 and P2 of interpolator 16b during normal operation. However, when the built in self test is activated, the signal BENbar turns off transistors 1–4 which turn off the differential pairs P1 and P2 and signal BEN turns on transistors 5 and 6. With the differential pairs P1 and P2 off, the current signals on nodes SRCO and SRCE coming from the current switch array 16a are effectively rerouted into the current comparator 16d.

When enabled during BIST operation, current comparator 16d of FIG. 3 effectively compares the currents through nodes SRCO and SRCE with a reference equal to ½ unit current and outputs the results as signal BISTOUT. The signal BISTOUT is sent to an unillustrated serial port of the device. The bits of the serial port will indicate whether the device passed the BIST operation or failed the BIST operation as well as give some indication of which current source transistor T1–T16, differential pair D1–D16 or flip flop FF1–FF16 is actually failing. This information can be very useful in performing a failure analysis on failing devices. The BIST test is initialized by a bit in an unillustrated test mode register. During the BIST test digital circuitry that has been added to phase select register 20 of FIG. 1 controls the value of the thermometer code register 20a such that the current through the active node (SRCO or SRCE) is either 0 or 1 unit current. SRCO and SRCE are not active at the same time.

In performing the test of the current mode interpolator, the sequence of operations for the BIST are summarized in the following assuming that when the current is less than ½ the unit current, the current comparator 16d outputs a logic 1.

1. Set the thermometer code 20a to all logic 0s and compare with the current through node SRCO. Since all of the current should be steered into node SRCE, this comparison should result in a logic 1. If this fails, the Q output of some bit in the thermometer code register is effectively stuck at logic 1.

2. Shift a single logic 1 through the thermometer code register 20a and compare against the current through node SRCO after each shift. Since only one bit in the thermometer code register is logic 1, the current IO should equal Iu and all of these comparisons should result in a logic 0. Any comparison that results in a logic 1 indicates that the Q output of current bit of the thermometer code is effectively stuck at logic 0 or there is an open associated with the transistor connected to this Q output in differential pairs D1–D16.

3. Set the thermometer code register 20a to all logic 1s and compare with the current through node SRCE. Since all of the current is now steered into node SRCO, this comparison should be a logic 1. If not, some Qbar output in the thermometer code register 20a is effectively stuck at logic 1.

4. Shift a single logic 0 through the thermometer code register 20a and compare against the current through node SRCE after each shift. As in step 2, there should be a single unit current through node SRCE and every comparison should result in a logic 0. Any comparison that results in a logic 1 indicates that the Qbar output of the current bit of the thermometer code 20a is stuck at logic 0 or there is an open associated with the transistor connected to this Qbar output in differential pairs D1–D16.

In further explanation of the method of the invention, under normal operation, the thermometer code register 20a contains a string of logic 0's followed by a string of logic 1's. Let N be the number of bits in the register (sixteen in system 10). Also, assume the $1^{st}$ n bits are 0. The current through any switch transistor T1–T16 is a unit of current Iu. Then IO=(N−n)Iu and IE=nIE. With this type of register, one would normally need a current-input analog to digital converter with N compare levels in order to determine if a single bit failed. Since such an analog to digital converter would consume almost as much analog circuitry as the analog portion of the actual clock interpolator circuit being tested, such a solution is not suitable. Instead, the BIST method of the invention takes control of the thermometer code register 20a and forces one of the following conditions:

|   | Condition | IE | IO |
|---|---|---|---|
| 1. | all zeroes | NIu | 0 |
| 2. | Exactly 1 one | (N−1)Iu | Iu |
| 3. | all ones | 0 | NIu |
| 4. | Exactly 1 zero | Iu | (N−1)Iu |

By treating conditions (1,2) and (3,4) separately, comparing against a current of ½Iu is sufficient to verify all of the bit positions while only requiring the addition of the simple current comparators 16d.

Figure 4:
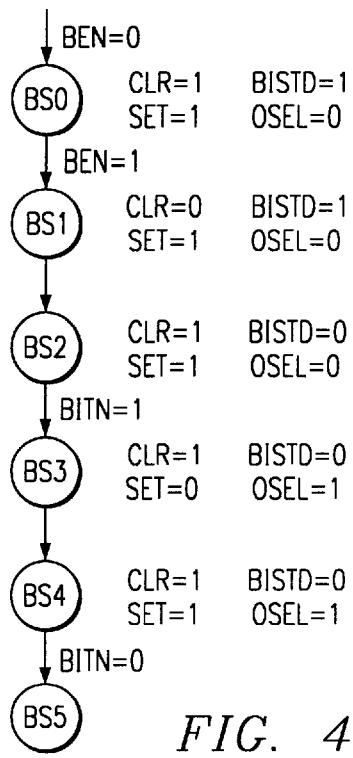
FIG. 4 is a state diagram of the digital state machine used to implement the invention.

A simple digital state machine is needed to sequence the thermometer code register 20a through the four conditions referred to above. FIG. 4 is a state diagram suitably illustrating the conditions of a digital state machine (which is located within phase select logic 20 of FIG. 1) needed to produce the four conditions needed to internally test the device. The thermometer code register 20a is a simple shift register; thus, $Qn=Qn-1$ and $Q0=BISTD$.

BIST State 0: This is the rest state in which the digital state machine resides when the BIST Enable signal is a logic level 0 (BEN=0). In this state CLR=1, SET=1, BISTD=1 and OSEL=0. In this state, the device is operating normally.

BIST State 1: The digital state machine moves to this state when the BIST Enable signal is a logic 1 (BEN=1), starting the test procedure. Here, the thermometer code register 20a is set to all logic level 0's. In this state CLR=0, SET=1, BISTD=1 and OSEL=0. Bit 0 or the thermometer code register 20a goes to a logic level 1 on the transition from this state to BIST state 2.

BIST State 2: The digital state machine remains in this state while a single logic level 1 is shifted through the thermometer code register 20a. In this state CLR=1, SET=1, BISTD=0 and OSEL=0.

BIST State 3: The digital state machine moves to this state when the Nth stage of the thermometer code register 20a has been set to a logic level 1. Here the thermometer code register is set to all logic level 1 s. In this state, CLR=1, SET=0, BISTD=0 and OSEL=1. Bit 0 of the thermometer code register 20a will transition to a logic 0 when the state machine transitions from this state to BIST State 4.

BIST State 4. The digital state machine remains in this state while single logic level 0 is shifted through the thermometer code register. In this state CLR=1, SET=1, BIST=0 and OSEL=1.

BIST State 5. The digital state machine moves to this state when the Nth stage of the thermometer code register has been set to a logic level 0, indicating that the test sequence has been completed.

It will be noted that OSEL is at a logic level 0 in BIST States 1 and 2, but a logic level 1 in BIST States 3 and 4. This controls the output multiplexor to determine whether current IE or IO is being compared. When OSEL is a logic 0, current IO is being compared and when OSEL is a logic 1, current IE is being compared. The whole self test is very fast and requires only 2N+2 test cycles to complete.

While the invention has been particularly shown and described by the foregoing detailed description, it will be understood by those skilled in the art that various other changes in form and detail may be made without departing from the spirit and scope of the invention as defined by the following claims.

What is claimed is:

1. A method of self testing a current mode interpolator, comprising the steps of:

causing an integrated circuit to enter a self test condition by entering a code into a port of the integrated circuit;

turning off differential pairs of transistors connected to the two phases of a clock signal;

turning on a current comparator connected to a current switch array, the current comparator having a reference current equal to about ½ unit of current as that of the current switch array;

setting a thermometer code register connected to the current switch array to a known condition;

comparing the current from the current switch array against the reference current; and generating a signal indicative of whether the current comparison produced an expected result.

2. The method of testing in claim 1 wherein a digital state machine forces the output of the thermometer code register to the known condition.

3. The method of testing in claim 1 the current comparator is not utilized by the current mode interpolator when the self testing is not performed.

4. A method of self testing a current mode interpolator found in an integrated circuit having at least one port, comprising the steps of:

causing the integrated circuit to enter a self test condition by entering a code into the integrated circuit's port;

turning on a current comparator connected to a current switch array, the current comparator having a reference current equal to a predetermined amount of the current switch array's current;

setting a thermometer code register connected to the current switch array to a known condition;

comparing the current from the current switch array against the reference current; and generating a signal indicative of whether the current comparison produced an expected result.

5. The method of testing defined in claim 4, further comprising the step of:

forcing the output of the thermometer code register to the known condition using a digital state machine.

6. The method of testing defined in claim 4, further comprising the step of: turning off at least one differential pair of transistors connected to two phases of a clock signal upon entering the self test condition.

7. The method of testing defined in claim 4, wherein the signal indicative of whether the current comparison produced an expected result determines if the at least one differential pair of transistors is operating normally.

8. The method of testing defined in claim 4, wherein the signal indicative of whether the current comparison produced an expected result determines if the thermometer code register is operating normally.

* * * * *